(12) United States Patent
Liu et al.

(10) Patent No.: US 11,824,002 B2
(45) Date of Patent: Nov. 21, 2023

(54) VARIABLE PITCH AND STACK HEIGHT FOR HIGH PERFORMANCE INTERCONNECTS

(71) Applicant: Intel Corporation, Santa Clara, CA (US)

(72) Inventors: En-Shao Liu, Portland, OR (US);
Joodong Park, Portland, OR (US);
Chen-Guan Lee, Portland, OR (US);
Walid M. Hafez, Portland, OR (US);
Chia-Hong Jan, Portland, OR (US);
Jiansheng Xu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 996 days.

(21) Appl. No.: 16/457,712

(22) Filed: Jun. 28, 2019

(65) Prior Publication Data

US 2020/0411435 A1    Dec. 31, 2020

(51) Int. Cl.
*H01L 23/528* (2006.01)
*H01L 21/768* (2006.01)
*H01L 23/532* (2006.01)
*H01L 23/522* (2006.01)

(52) U.S. Cl.
CPC .... *H01L 23/5283* (2013.01); *H01L 21/76816* (2013.01); *H01L 21/76877* (2013.01); *H01L 23/5226* (2013.01); *H01L 23/53209* (2013.01)

(58) Field of Classification Search
CPC ........... H01L 23/5283; H01L 21/76816; H01L 21/76877; H01L 23/5226; H01L 23/53209; H01L 21/76883; H01L 21/76838
See application file for complete search history.

(56) References Cited

U.S. PATENT DOCUMENTS

| | | | | |
|---|---|---|---|---|
| 5,357,140 A * | 10/1994 | Kozasa | ............... | H01L 23/5283 257/E23.152 |
| 6,225,207 B1 * | 5/2001 | Parikh | ............... | H01L 21/76808 438/738 |
| 6,284,642 B1 * | 9/2001 | Liu | ................... | H01L 21/76807 438/622 |
| 6,297,156 B1 * | 10/2001 | Farrar | ................... | H01L 23/535 257/E23.168 |
| 6,624,514 B2 * | 9/2003 | Kasai | .................. | H01L 23/5329 257/E23.152 |
| 9,793,156 B1 * | 10/2017 | Yang | .................. | H01L 21/76838 |
| 9,793,206 B1 * | 10/2017 | Briggs | ............... | H01L 21/76834 |
| 2002/0163086 A1 * | 11/2002 | Toyoda | ............. | H01L 21/76808 257/E23.152 |

(Continued)

*Primary Examiner* — Caleb E Henry
(74) *Attorney, Agent, or Firm* — Schwabe, Williamson & Wyatt, P.C.

(57) ABSTRACT

An integrated circuit structure comprises a base and a plurality of metal levels over the base. A first metal level includes a first dielectric material. The first metal level further includes a first plurality of interconnect lines in the first dielectric material, wherein the first plurality of interconnect lines in the first metal level have variable widths from relatively narrow to relatively wide, and wherein the first plurality of interconnect lines have variable heights based on the variable widths, such that a relatively wide one of the first plurality of interconnect lines has a taller height from the substrate than a relatively narrow one of the first plurality of interconnect lines, and a shorter distance to a top of the first metal level.

25 Claims, 9 Drawing Sheets

(56) References Cited

U.S. PATENT DOCUMENTS

| | | | |
|---|---|---|---|
| 2003/0146516 A1* | 8/2003 | Amishiro | H01L 23/5222 |
| | | | 257/E23.152 |
| 2003/0189254 A1* | 10/2003 | Yew | H01L 21/76832 |
| | | | 257/773 |
| 2008/0122089 A1* | 5/2008 | Iijima | H01L 23/5283 |
| | | | 257/E23.152 |
| 2013/0020712 A1* | 1/2013 | Aipperspach | H01L 21/76816 |
| | | | 257/773 |
| 2013/0069238 A1* | 3/2013 | Usami | H01L 21/76897 |
| | | | 257/769 |
| 2013/0161798 A1* | 6/2013 | Tomizawa | H01L 21/02063 |
| | | | 257/E21.24 |
| 2014/0151893 A1* | 6/2014 | Boyanov | H01L 21/76883 |
| | | | 257/774 |
| 2014/0264902 A1* | 9/2014 | Ting | H01L 21/76843 |
| | | | 438/618 |
| 2017/0018499 A1* | 1/2017 | Chen | H01L 23/5283 |
| 2017/0263553 A1* | 9/2017 | Schenker | H01L 21/76808 |
| 2018/0166330 A1* | 6/2018 | Chu | H01L 21/31144 |
| 2019/0122981 A1* | 4/2019 | Plavidal | H01L 24/11 |
| 2019/0237361 A1* | 8/2019 | Usami | H01L 23/53209 |

\* cited by examiner

VARIABLE PITCH AND STACK HEIGHT FOR HIGH PERFORMANCE INTERCONNECTS

TECHNICAL FIELD

Embodiments of the disclosure are in the field of integrated circuit structures and, in particular, variable pitch and stack height for high performance interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and state-of-the-art fabrication processes may limit the possibility to further extend them into the sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
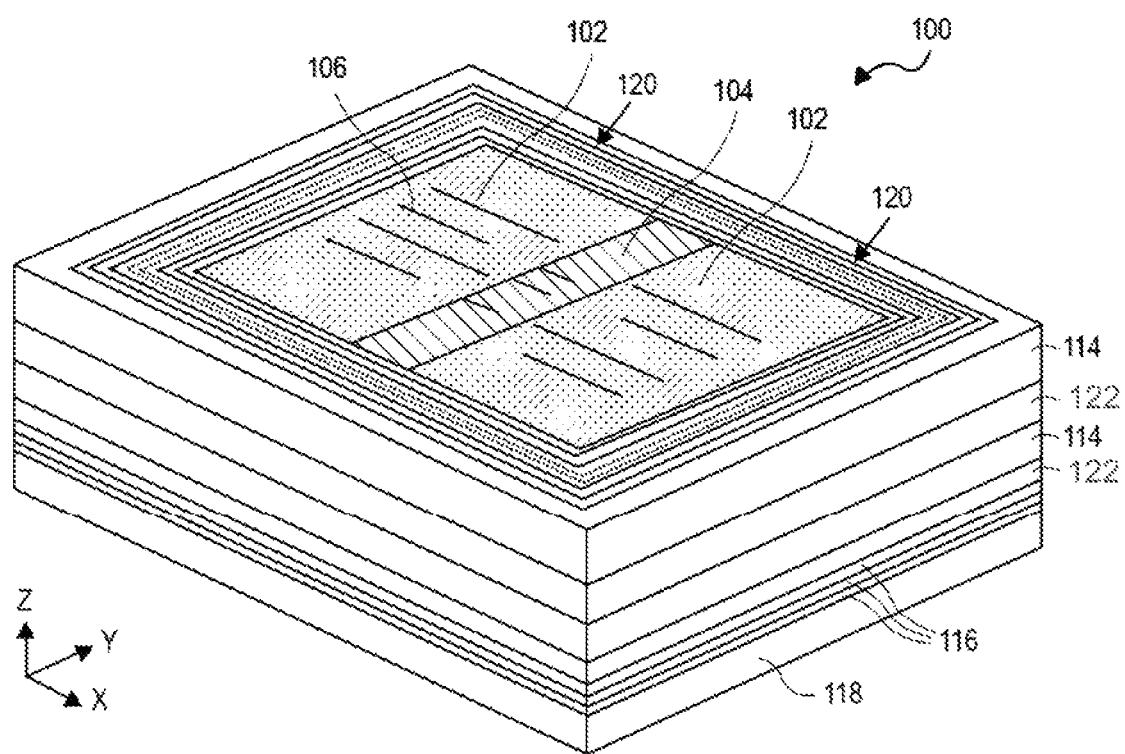
FIG. 1A illustrates a perspective view of a die having active regions and transition regions.

Variable pitch and stack height for high performance interconnects are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to variable pitch and stack height for high performance interconnects. Embodiments may include or pertain to one or more of RF transistors, low latency logic chips, and system-on-chip (SoC) technologies. One or more embodiments may be implemented to realize high performance transistors to potentially increase monolithic integration of backend logic in SoCs of future technology nodes.

To provide context, a conventional method of fabricating conductive structures in an integrated circuit (IC) is to form open regions over a substrate or wafer and to deposit a conductive material in the open regions to form the conductive structure. For example, to form an interconnect, a dielectric layer is deposited and etched to form a pattern of openings or trenches (and/or vias). Next, a conductive material is deposited into the trenches to form interconnects. Another example is the formation of a transistor gate stack that includes a gate electrode and a gate dielectric formed over one or more fins to define the channel regions. Such a gate stack may be fabricated using a replacement gate process in which a dummy gate is deposited and patterned over fins, and spacers are formed adjacent on both sides of the dummy gate. An insulating material is deposited over the dummy gate and spacers, and the dummy gate is removed, leaving openings or trenches between the spacers that expose the channel regions of the transistors. The dummy gate material removed from the openings is then replaced with, for example, a high-k dielectric and a replacement metal gate material to form the gate stack.

After a conductive material is deposited into the open regions, the conductive material that lies above the surface of the dielectric layer referred to as overburden is removed through a chemical-mechanical polishing (CMP) process. CMP is used to planarize a variety of materials used in semiconductor integrated circuit (IC) devices. For example, CMP is used to polish dielectric layers such as silicon dioxide, and metal layers such as tungsten, aluminum and copper. Regardless of the material being polished, similar polishing techniques are used to remove the excess conductive material above the dielectric layer while obtaining a planar surface.

As technology node continues to advance, properties (e.g. resistance and capacitance) of conductive structures, such as interconnects, start to become dominating factors for circuit performance. Existing interconnect architectures have limited freedom, leading to tight design window for scaling and performance targeting. The primary goals of interconnect scaling focuses on reducing the required chip footprint, while at the same time maintaining/improving the signal delay from metal line resistance and capacitance. This is primarily completed through careful metal line pitch/width/height optimization. Existing technology solutions might have different interconnect line width at certain metal layers for circuit performance optimization. However, a fixed metal height at a specific metal layer is typically exercised, restricting further design optimization opportunities.

In accordance with one or more embodiments described herein, metal height is introduced as another degree of freedom for interconnect resistance and capacitance optimization. More specifically, an IC may have a plurality of metal levels or layers with at least one of the metal levels having variable width and variable height interconnects. Processes for fabricating the variable height interconnects does not need additional photo masks, reducing manufacturing costs. An IC fabricated using such an architecture may exhibit improved ability to optimize interconnect resistance and capacitance.

FIG. 1A illustrates a perspective view of a die 100 having active regions 102 and transition regions 104. At least a portion of active regions 102 and transition regions 104 may include conductive structures, such as interconnect lines 106. For example, the active regions 102 may contain interconnects lines 106 and one or more active semiconductor devices (e.g., transistors, diodes), passive devices (e.g., resistors, capacitors, inductors) assembled to form an integrated circuit. The transition regions 104 may contain interconnect lines 106 and only inactive structures. The active regions 102 and the transition regions 104 may be formed within several semiconductor material layers 116 over a base 118. Some conductive structures, such as interconnect lines 106, may be formed in each of a plurality of metallization or metal levels 114, such as poly/device, metal 0 (M0), metal 1 (M1), metal 2 (M2), metal 3 (M3), and so on. The metal levels 114 and via layers 122 between the metal levels are formed on top of the semiconductor material layers 116. Additional material layers may exist above or below the layers shown in FIG. 1A. The die 100 may optionally include other conductive structures such as a guard ring 120. The base 118 can comprise, for example, a bulk semiconductor wafer (e.g., silicon) or a substrate material (e.g., sapphire).

According to the disclosed embodiments, an integrated circuit (IC) on the die 100 may have a plurality of metal levels 114, wherein at least one of the metal levels 114 comprises variable height interconnect lines 106A and 106B, rather than fixed height interconnect lines within a metal layer, to provide the ability to tune metal resistance of the interconnect lines 106.

Figure 1B:
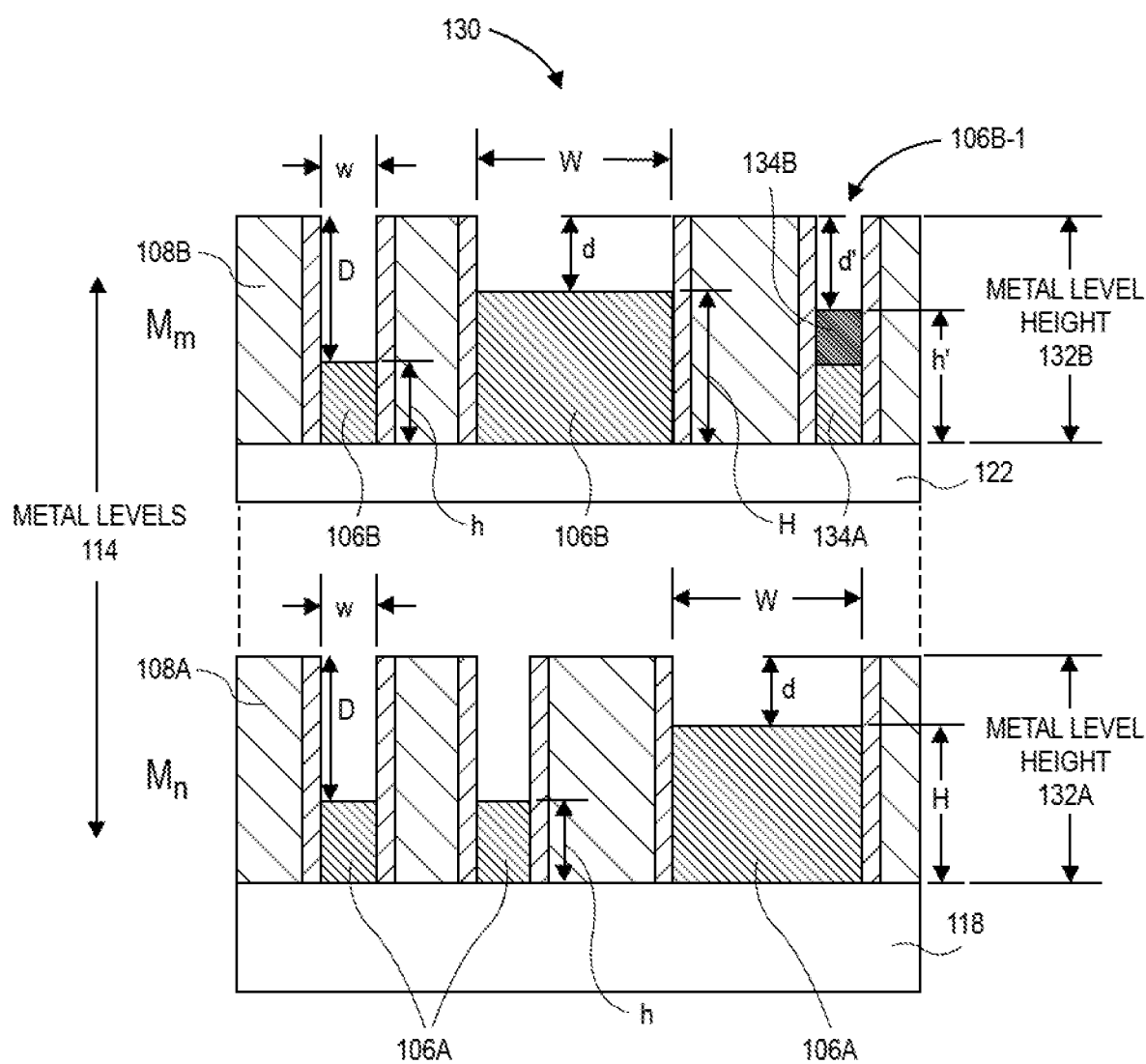
FIG. 1B is a cross-section view of the die showing a portion of an IC fabricated with metal layers having variable height interconnect lines.

FIG. 1B is a cross-section view of the die 100 showing a portion of an IC 130 fabricated with metal layers having variable height interconnect lines 106. The cross-section view is along an orthogonal-to-interconnect line direction. The IC 130 includes a plurality of metal levels 114 separated by via layers 122 over a base 118, and each of the metal levels 114 has a metal level height 132A and 132B (which may be the same or different). For example, a first metal level $M_n$ (or the $M_n$ level) has a first metal level height 132A and includes a first dielectric material 108A and a first plurality of interconnect lines 106A formed in the dielectric material 108. The first plurality of interconnect lines 106A are substantially parallel (e.g., within +−5 degrees) and run along a first direction (in and out of the page in this view).

According to the disclosed embodiments, the first plurality of interconnect lines 106A in the $M_n$ level have variable widths from relatively narrow (w) to relatively wide (W). In addition, the first plurality of interconnect lines 106A have variable heights (e.g., h, H) based on the variable widths, such that a relatively wide (W) one of the first plurality of interconnect lines 106A has a taller height than a relatively narrow (w) one of the first plurality of interconnect lines 106A measured from the base 118, and a shorter distance (e.g., d, D), from a top of the first metal level.

As a further example, the IC 130 includes a second metal level Mm (or the Mm level), which may be one or more other metal levels 114 above the first metal level. The second metal level Mm includes a via layer 122 and a second dielectric material 108B over the via layer 122, wherein the second plurality of interconnect lines 106B is formed in the second dielectric material 108B. According to the disclosed embodiments, the second plurality of interconnect lines 106B in Mm have variable widths from relatively narrow (w) to relatively wide (W). In addition, the second plurality of interconnect lines 106B have variable heights (e.g., h, H, h') based on the variable widths, such that a relatively wide (W) one of the second plurality of interconnect lines 106B has a taller height than a relatively narrow (w) one of the second plurality of interconnect lines 106B measured from the via layer 122, and a shorter distance (e.g., d, D, d'), from a top of the second metal level.

In embodiments, the width (w) of the relatively narrow interconnect lines 106A and 106B ranges from approximately 10-100 nm, while the width (W) of the relatively wide interconnect lines 106A and 106B ranges from approximately 100 nm-200 microns.

In embodiments, a difference in the height between the plurality of interconnects 106A and 106B is approximately up to 200%. In one specific example, the difference in the height between the plurality of interconnects 106A and 106B may range from approximately 50-100 nm. A maximum height of the interconnect lines 106A and 106B in each metal level 114 is limited by the metal level height 132A and 132B of that metal level. In embodiments, the variable heights of the first plurality of interconnect lines 106A and 106B range from approximately 50-200 nm.

In one embodiment, the interconnect lines 106A and 106B may comprise a conductive fill material, such as a metal or other suitable material. Examples of metals include cobalt, copper, titanium, aluminum or other suitable metal. The via layer 122 may comprise the same or different material of dielectric material 108A and 108B except for vias formed therein. Examples of dielectric materials 108A and 108B include silicon dioxide ($SiO_2$) titanium nitride (TiN), silicon nitride ($Si_3N_4$) or other suitable dielectric material.

According to a further aspect of the disclosed embodiments, at least one of the first and second metal levels $M_n$ and Mm may include at least one interconnect line 106A and 106B composed of two or more metal materials, instead of one. For example, the second metal level Mm is shown with an interconnect line 106B-1 composed of a first metal material 134A and a second metal material 134B over the first metal material 134A. In one embodiment, the first metal material 134A is different from the second metal material 134B. However, in another embodiment, the first metal material 134A is the same as the second metal material 134B.

Cross-sectional transmission electron microscope (XTEM) specimens of the IC (or any other suitable detection tool) can detect the use of the presence of interconnect lines formed with variable widths and stack heights. For example, even in the embodiment where the first metal material 134A and the second metal material 134B comprise the same materials, the XTEM can identify a grain boundary between the two different materials.

According to the disclosed embodiments, the variable width and variable height interconnect lines provide the ability to tune metal resistance in the interconnect lines to optimally route a signal to a wider trench, which now features a taller metal height to lower resistance and enabling a faster signal.

Figure 2A:
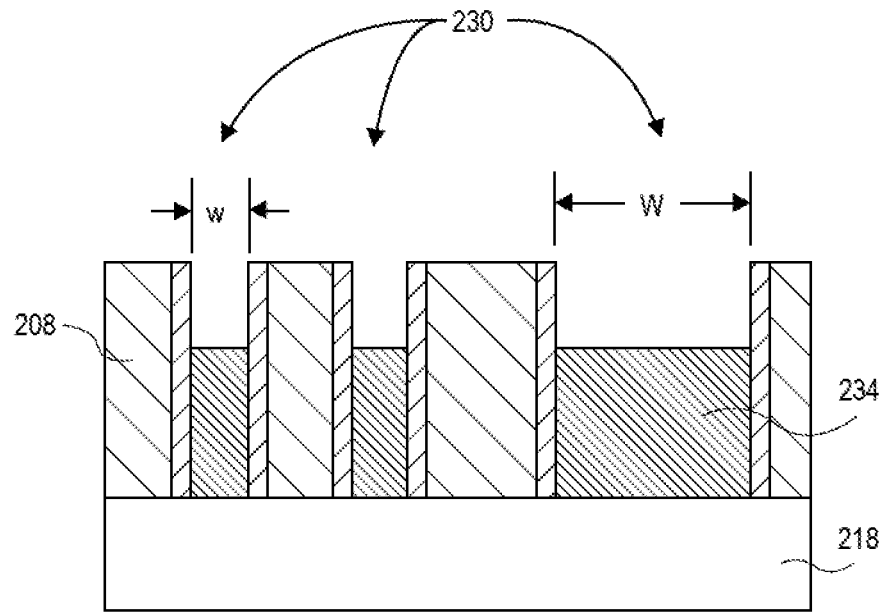
FIGS. 2A-2D illustrate a method of fabricating an IC with variable width and variable height interconnect lines in accordance with a first embodiment.

FIGS. 2A-2D illustrate a method of fabricating an IC with variable width and variable height interconnect lines in accordance with a first embodiment. FIG. 2A illustrates the fabrication process after a dielectric material 208 is patterned and etched over base 218 in a metal level of an IC to form trenches 230 that have variable widths from relatively narrow (w) trenches to relatively wide (W) trenches. Thereafter a conductive material 234 is deposited to fill trenches 230 to fill the relatively narrow (w) trenches and the relatively wide (W) trenches. A first etch process is performed to recess the conductive material 234 in the trenches 230 using either a wet or dry etch.

Figure 2B:
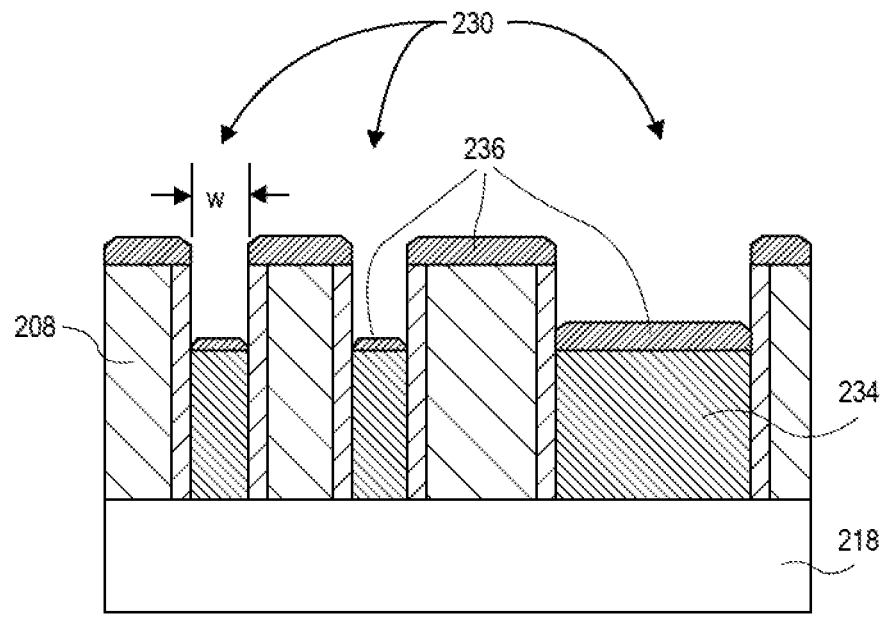
Figure 2C:
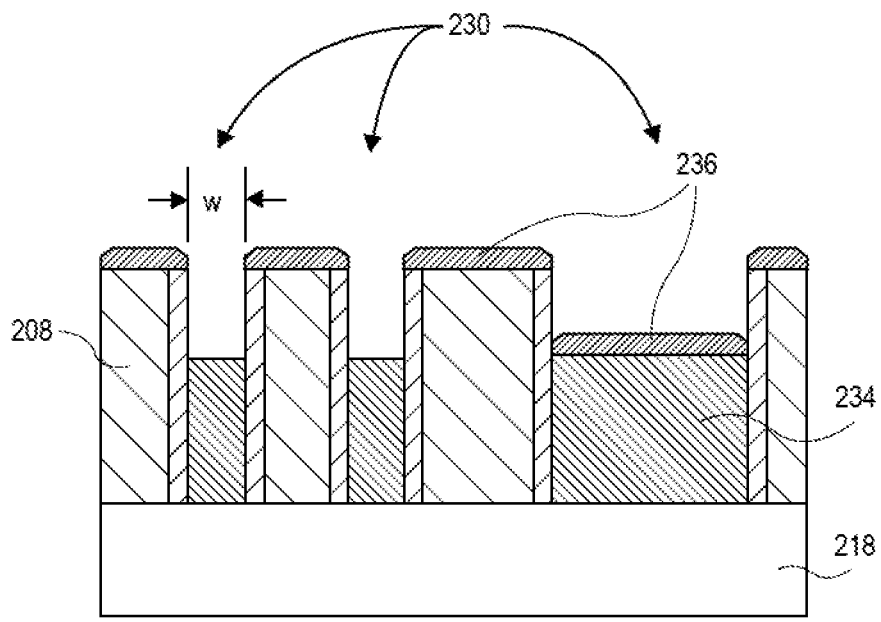

FIG. 2B illustrates the fabrication process after an etch stop material 236 is directionally deposited over the IC, covering surfaces of the dielectric material 208 and the conductive material 234. Directional deposition of the etch stop material 236 may be carried out through sputtering or plasma-enhanced chemical vapor deposition (PECVD). Due to the difference aspect ratio, the amount of the etch stop material 236 landing at the bottom of the trenches 230 are different, typically the etch stop material 236 is thicker in the relatively wide (W) trenches. The material selection criteria of the etch stop material 236 is that it needs to be resistant to an etch process (FIG. 2D) following an etch back process (FIG. 2C). In an embodiment, the etch stop material 236 has a selectivity to the conductive material 234.

In one embodiment, the etch stop material 236 may comprise a conductive material, such as a metal, or other suitable material. In this embodiment, the conductive material comprising the etch stop material 236 is the same as the conductive material 234. However, in another embodiment, the conductive material comprising the etch stop material 236 is different from the conductive material 234. In another embodiment, the etch stop material 236 may comprise a non-conductive material.

FIG. 2C illustrates the fabrication process after an etch back process is performed to remove portions of the etch stop material 236 from the tops of the conductive material 234 in the relatively narrow (w) trenches.

Figure 2D:
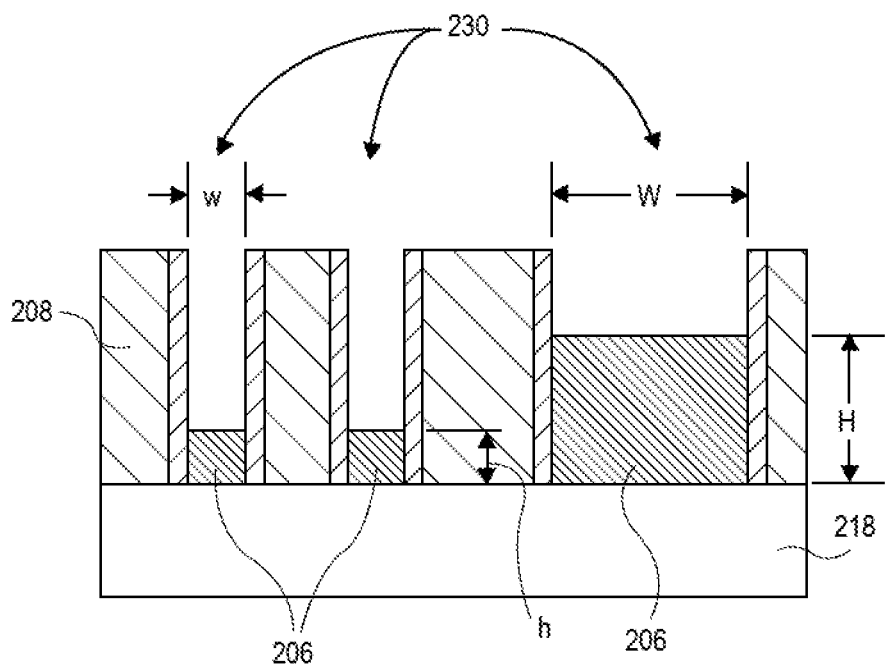

FIG. 2D illustrates the fabrication process after a second etch process is performed to remove the remainder of the etch stop material 236 and to further recess the conductive material 234 in the relatively narrow (w) trenches, resulting in formation of a plurality of interconnect lines 206. In embodiments, the second etch process may be either a wet or dry etch. Due to the presence of the etch stop material 236 still present in the relatively wide (W) trenches, the final metal height can be differentiated between in the relatively narrow (w) trenches and the relatively wide (W) trenches. Accordingly interconnect lines 206 are formed with variable widths and variable heights without requiring additional photomasks, reducing manufacturing costs.

In one embodiment, the trenches 230 are patterned such that a width of the relatively narrow (w) trenches range from approximately 10-100 nm, and a width of the relatively wide (W) trenches range from approximately 100 nm-200 microns. In one embodiment, deposition of the conductive material 234 and the second etch process are performed such that a difference in height between the plurality of interconnect lines 206 is approximately up to 200%. In one embodiment, the difference in the height between the plurality of interconnect lines 206 ranges from approximately 50-100 nm. In addition, the maximum height of the plurality of interconnect lines 206 is limited by the height of the metal level. In one embodiment, the variable heights of the plurality of interconnect lines 206 range from approximately 50-200 nm.

Figure 3A:
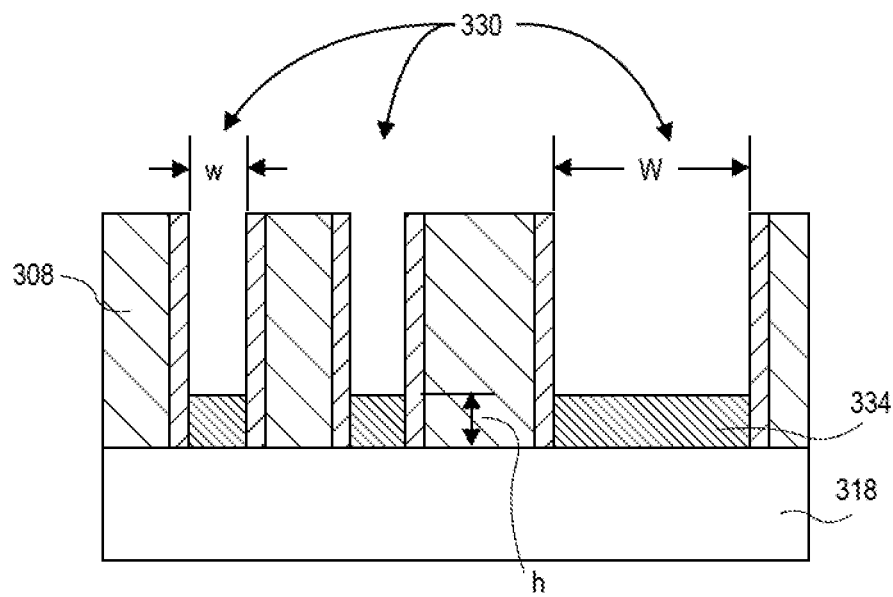
FIGS. 3A-3C illustrate a method of fabricating an IC with variable width and variable height interconnect lines in accordance with a second embodiment.
Figure 3B:
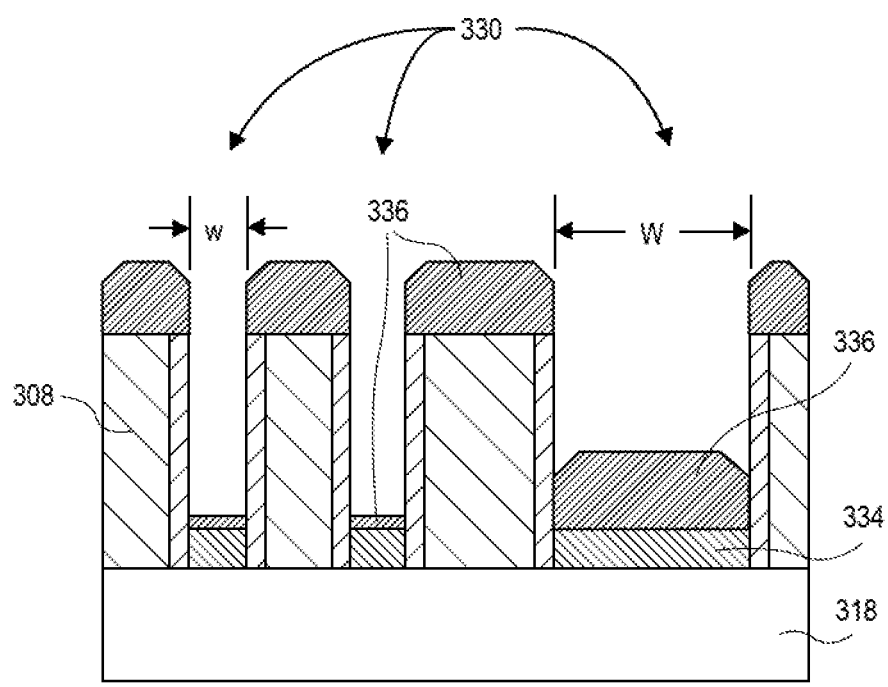
Figure 3C:
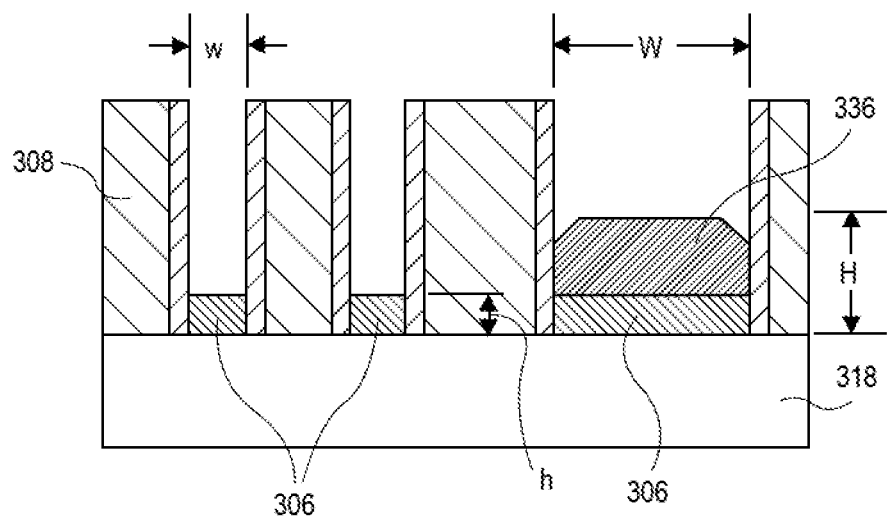

FIGS. 3A-3C illustrate a method of fabricating an IC with variable width and variable height interconnect lines in accordance with a second embodiment. Similar to FIG. 2A, FIG. 3A illustrates the fabrication process after a dielectric material 308 is patterned and etched in a metal level of an IC to form trenches 330 over base 318 that have variable widths from relatively narrow (w) trenches to relatively wide (W) trenches. Thereafter a conductive material 334 is deposited to fill trenches 330 to fill the relatively narrow (w) trenches and the relatively wide (W) trenches. However, unlike the process of FIG. 2A, a first etch process is performed to recess the conductive material 334 in the trenches 330 to a target height (h) designated for relatively thin interconnect lines. The first etch may be performed using either a wet or dry etch.

FIG. 3B illustrates the fabrication process after a metal back-fill material 336 is directionally deposited over the IC with directional deposition techniques to cover surfaces of the dielectric material 308 and the conductive material 334. Directional deposition of the metal back-fill material 336 may be carried out through sputtering or plasma-enhanced chemical vapor deposition (PECVD). Again due to the difference aspect ratio, the amount of the metal back-fill material 336 landing at the bottom of the trenches are different, typically the metal back-fill material 336 is thicker in the relatively wide (W) trenches.

FIG. 3C illustrates the fabrication process after an etch back process is performed to remove portions of the metal back-fill material 336 from the dielectric material 308, and from the conductive material 334 in the relatively narrow (w) trenches, resulting in a plurality of interconnect lines 306 having variable widths and variable heights (h, H) at the specific metal level.

In one embodiment, the trenches 330 are patterned such that a width of the relatively narrow (w) trenches range from approximately 10-100 nm, and a width of the relatively wide (W) trenches range from approximately 100 nm-200 microns. In one embodiment, the fabrication process results a difference in height between the plurality interconnect lines 306 is approximately up to 200%. In one embodiment, the difference in the height between the plurality of interconnect lines 306 ranges from approximately 50-100 nm. In addition, the maximum height of the plurality of interconnect lines 306 is limited by the height of the metal level. In one embodiment, the variable heights of the plurality of interconnect lines 306 range from approximately 50-200 nm.

The integrated circuit structures described herein may be included in an electronic device. As an example of one such apparatus, FIGS. 4A and 4B are top views of a wafer and dies that include one or more interconnects with variable stack height, in accordance with one or more of the embodiments disclosed herein.

According to the fabrication process as described above, the disclosed embodiments reduce complexity of routing by eliminating the need to design an IC with different fixed height interconnect lines on different metal levels.

Figure 4B:
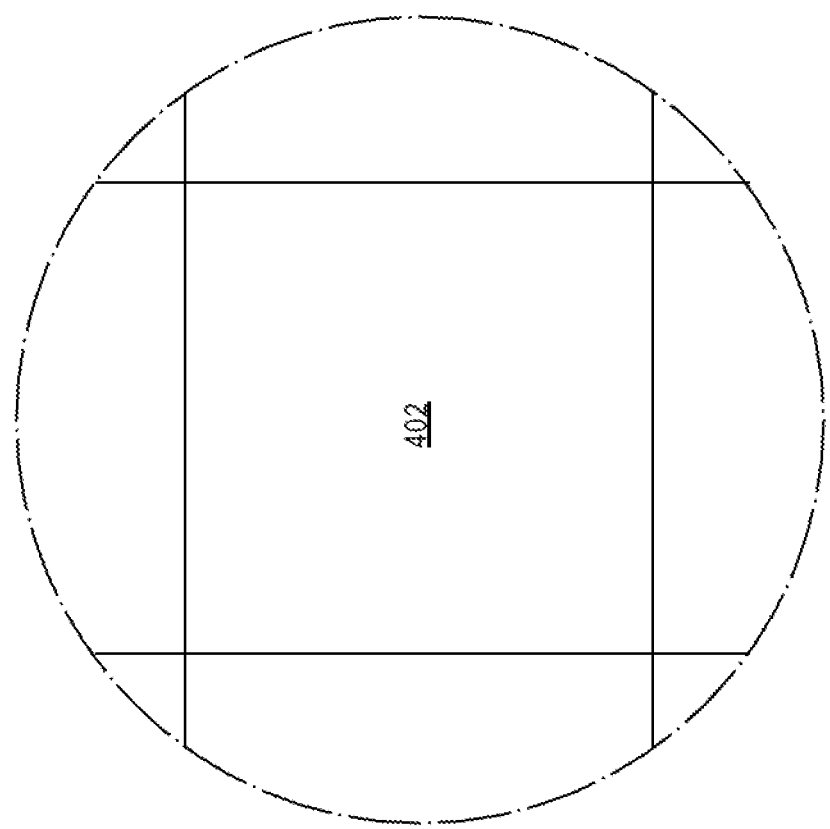
FIGS. 4A and 4B are top views of a wafer and dies that include one or more interconnects with variable stack height, in accordance with one or more of the embodiments disclosed herein.
Figure 4A:
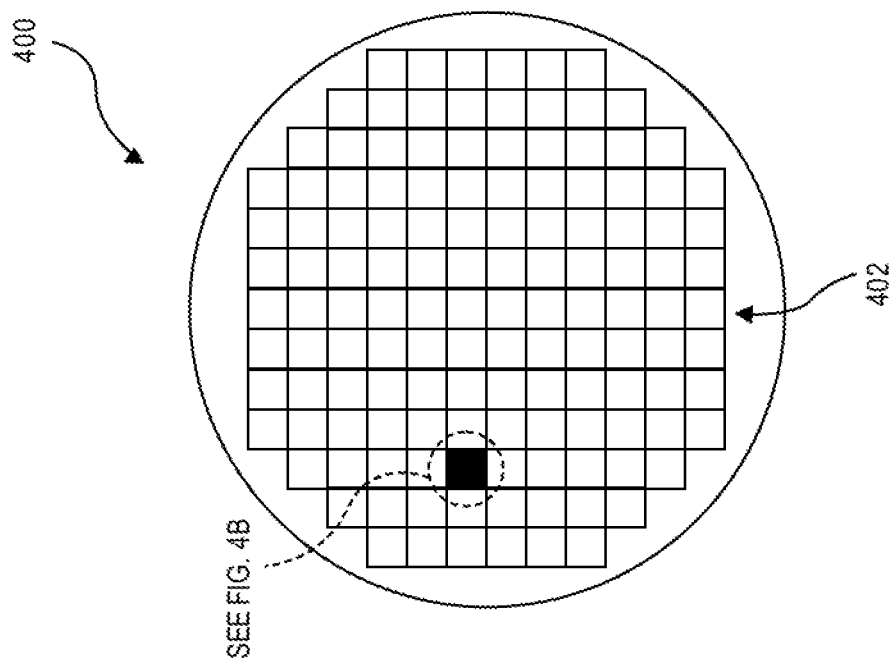

Referring to FIGS. 4A and 4B, a wafer 400 may be composed of semiconductor material and may include one or more dies 402 having integrated circuit (IC) structures formed on a surface of the wafer 400. Each of the dies 402 may be a repeating unit of a semiconductor product that includes any suitable IC (e.g., ICs including one or more interconnects with variable stack height, such as described above. After the fabrication of the semiconductor product is complete, the wafer 400 may undergo a singulation process in which each of the dies 402 is separated from one another to provide discrete "chips" of the semiconductor product. In particular, structures that include embedded non-volatile memory structures having an independently scaled selector as disclosed herein may take the form of the wafer 400 (e.g., not singulated) or the form of the die 402 (e.g., singulated). The die 402 may include one or more embedded non-volatile memory structures based independently scaled selectors and/or supporting circuitry to route electrical signals, as well as any other IC components. In some embodiments, the wafer 400 or the die 402 may include an additional memory device (e.g., a static random access memory (SRAM) device), a logic device (e.g., an AND, OR, NAND, or NOR gate), or any other suitable circuit element. Multiple ones of these devices may be combined on a single die 402. For example, a memory array formed by multiple memory devices may be formed on a same die 402 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 5:
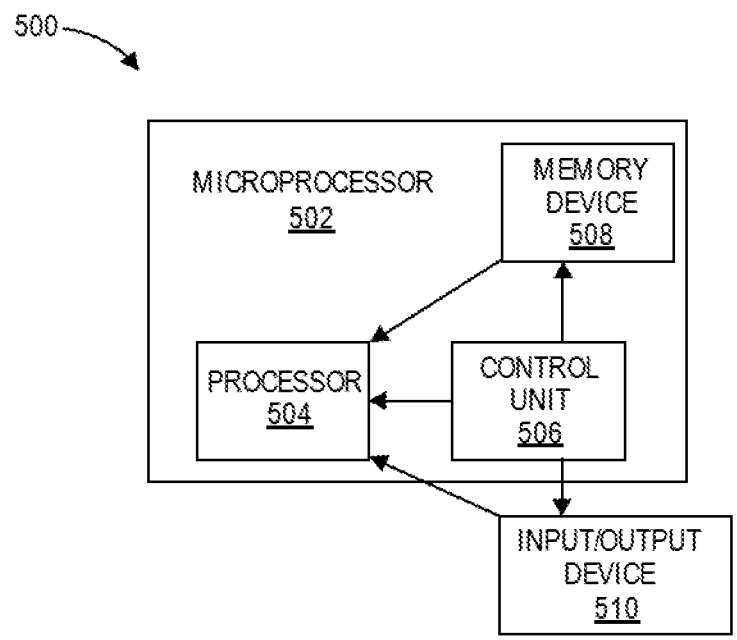
FIG. 5 illustrates a block diagram of an electronic system, in accordance with an embodiment of the present disclosure.

FIG. 5 illustrates a block diagram of an electronic system 500, in accordance with an embodiment of the present disclosure. The electronic system 500 can correspond to, for example, a portable system, a computer system, a process control system, or any other system that utilizes a processor and an associated memory. The electronic system 500 may include a microprocessor 502 (having a processor 504 and control unit 506), a memory device 508, and an input/output device 510 (it is to be appreciated that the electronic system 500 may have a plurality of processors, control units, memory device units and/or input/output devices in various embodiments). In one embodiment, the electronic system 500 has a set of instructions that define operations which are to be performed on data by the processor 504, as well as, other transactions between the processor 504, the memory device 508, and the input/output device 510. The control unit 506 coordinates the operations of the processor 504, the memory device 508 and the input/output device 510 by cycling through a set of operations that cause instructions to be retrieved from the memory device 508 and executed. The memory device 508 can include a non-volatile memory cell as described in the present description. In an embodiment, the memory device 508 is embedded in the microprocessor 502, as depicted in FIG. 5. In an embodiment, the processor 504, or another component of electronic system 500, includes one or more interconnects with variable stack height, such as those described herein.

Figure 6:
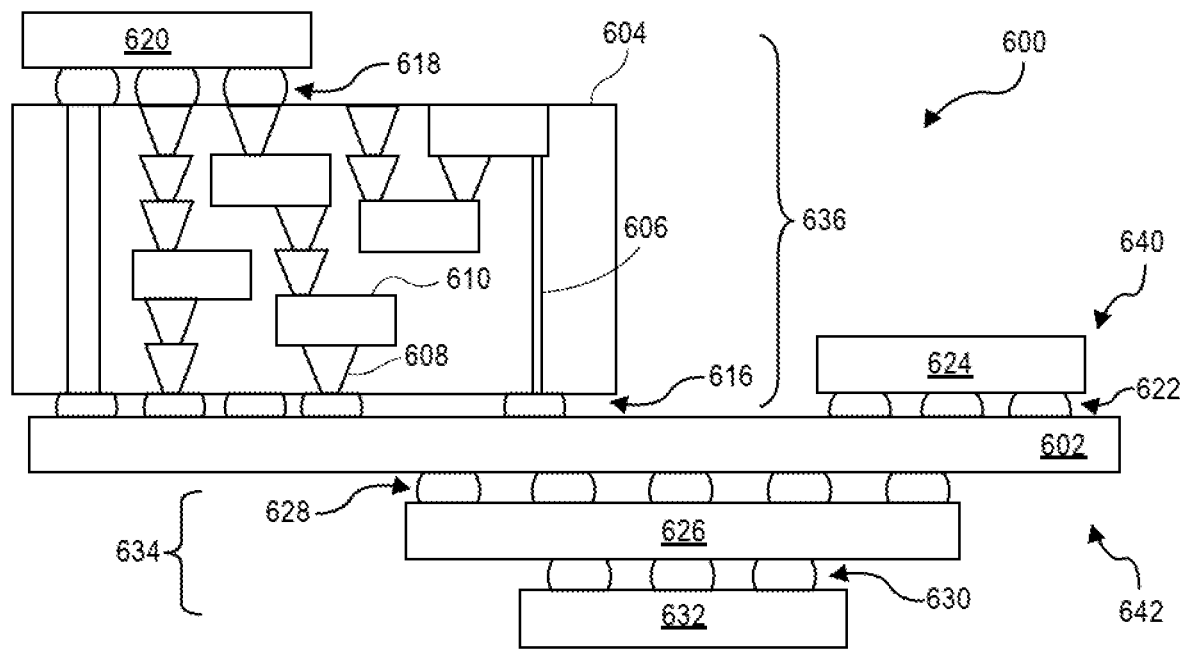
FIG. 6 is a cross-sectional side view of an integrated circuit (IC) device assembly that may include one or more interconnects with variable stack height, in accordance with one or more of the embodiments disclosed herein.

FIG. 6 is a cross-sectional side view of an integrated circuit (IC) device assembly that may include one or more interconnects with variable stack height, in accordance with one or more of the embodiments disclosed herein.

Referring to FIG. 6, an IC device assembly 600 includes components having one or more integrated circuit structures described herein. The IC device assembly 600 includes a number of components disposed on a circuit board 602 (which may be, e.g., a motherboard). The IC device assembly 600 includes components disposed on a first face 640 of the circuit board 602 and an opposing second face 642 of the circuit board 602. Generally, components may be disposed on one or both faces 640 and 642. In particular, any suitable ones of the components of the IC device assembly 600 may include a number of interconnects with variable stack height, such as disclosed herein.

In some embodiments, the circuit board 602 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 602. In other embodiments, the circuit board 602 may be a non-PCB substrate.

The IC device assembly 600 illustrated in FIG. 6 includes a package-on-interposer structure 636 coupled to the first face 640 of the circuit board 602 by coupling components 616. The coupling components 616 may electrically and mechanically couple the package-on-interposer structure 636 to the circuit board 602, and may include solder balls (as shown in FIG. 6), male and female portions of a socket, an adhesive, an underfill material, and/or any other suitable electrical and/or mechanical coupling structure.

The package-on-interposer structure 636 may include an IC package 620 coupled to an interposer 604 by coupling components 618. The coupling components 618 may take any suitable form for the application, such as the forms discussed above with reference to the coupling components 616. Although a single IC package 620 is shown in FIG. 6, multiple IC packages may be coupled to the interposer 604. It is to be appreciated that additional interposers may be coupled to the interposer 604. The interposer 604 may provide an intervening substrate used to bridge the circuit board 602 and the IC package 620. The IC package 620 may be or include, for example, a die (the die 402 of FIG. 4B), or any other suitable component. Generally, the interposer 604 may spread a connection to a wider pitch or reroute a connection to a different connection. For example, the interposer 604 may couple the IC package 620 (e.g., a die) to a ball grid array (BGA) of the coupling components 616 for coupling to the circuit board 602. In the embodiment illustrated in FIG. 6, the IC package 620 and the circuit board 602 are attached to opposing sides of the interposer 604. In other embodiments, the IC package 620 and the circuit board 602 may be attached to a same side of the interposer 604. In some embodiments, three or more components may be interconnected by way of the interposer 604.

The interposer 604 may be formed of an epoxy resin, a fiberglass-reinforced epoxy resin, a ceramic material, or a polymer material such as polyimide. In some implementations, the interposer 604 may be formed of alternate rigid or flexible materials that may include the same materials described above for use in a semiconductor substrate, such as silicon, germanium, and other group III-V and group IV materials. The interposer 604 may include metal interconnects 610 and vias 608, including but not limited to through-silicon vias (TSVs) 606. The interposer 604 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 604. The package-on-interposer structure 636 may take the form of any of the package-on-interposer structures known in the art.

The IC device assembly 600 may include an IC package 624 coupled to the first face 640 of the circuit board 602 by coupling components 622. The coupling components 622 may take the form of any of the embodiments discussed above with reference to the coupling components 616, and the IC package 624 may take the form of any of the embodiments discussed above with reference to the IC package 620.

The IC device assembly 600 illustrated in FIG. 6 includes a package-on-package structure 634 coupled to the second face 642 of the circuit board 602 by coupling components 628. The package-on-package structure 634 may include an IC package 626 and an IC package 632 coupled together by coupling components 630 such that the IC package 626 is disposed between the circuit board 602 and the IC package 632. The coupling components 628 and 630 may take the form of any of the embodiments of the coupling components 616 discussed above, and the IC packages 626 and 632 may take the form of any of the embodiments of the IC package 620 discussed above. The package-on-package structure 634 may be configured in accordance with any of the package-on-package structures known in the art.

Figure 7:
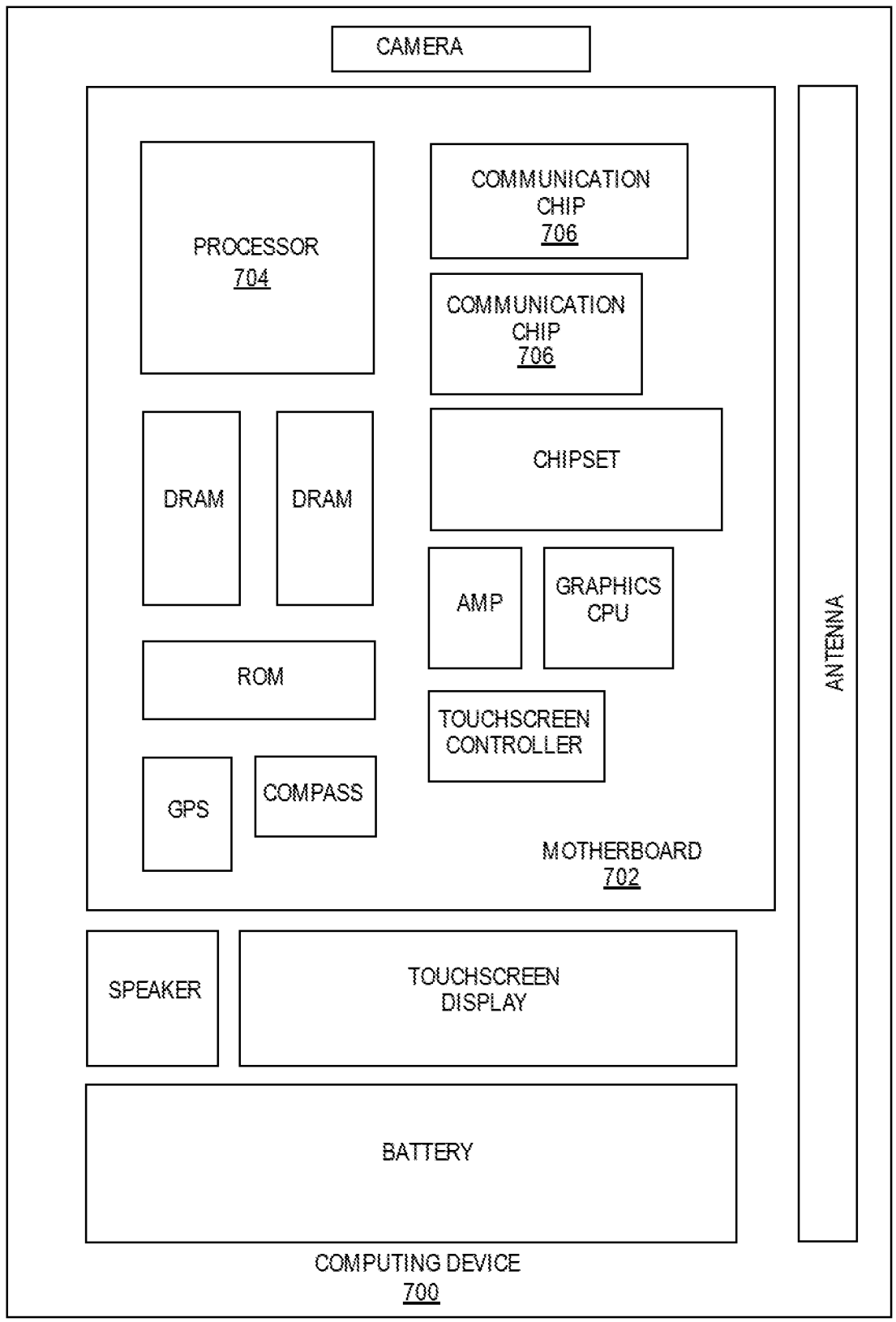
FIG. 7 illustrates a computing device in accordance with one implementation of the disclosure.

FIG. 7 illustrates a computing device 700 in accordance with one implementation of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the disclosure, the integrated circuit die of the processor includes one or more interconnects with variable stack height, in accordance with implementations of embodiments of the disclosure. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of embodiments of the disclosure, the integrated circuit die of the communication chip includes one or more interconnects with variable stack height, in accordance with implementations of embodiments of the disclosure.

In further implementations, another component housed within the computing device 700 may contain an integrated circuit die that includes one or more interconnects with variable stack height, in accordance with implementations of embodiments of the disclosure.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, embodiments described herein include interconnects with variable stack height.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure comprises a base and a plurality of metal levels over the base. A first metal level includes a first dielectric material. The first metal level further includes a first plurality of interconnect lines in the first dielectric material, wherein the first plurality of interconnect lines in the first metal level have variable widths from relatively narrow to relatively wide, and wherein the first plurality of interconnect lines have variable heights based on the variable widths, such that a relatively wide one of the first plurality of interconnect lines has a taller height from the substrate than a relatively narrow one of the first plurality of interconnect lines, and a shorter distance to a top of the first metal level.

Example embodiment 2: The integrated circuit structure of embodiment 1, further comprising a via layer and a second dielectric material over the via layer. A second plurality of interconnect lines is in the second dielectric material, wherein the second plurality of interconnect lines in the second metal level have variable widths from relatively narrow to relatively wide, and wherein the second plurality of interconnect lines have variable heights based on the variable widths, such that a relatively wide one of the second plurality of interconnect lines has a taller height from the via layer than a relatively narrow one of the second plurality of interconnect line, and a shorter distance to a top of the second metal level.

Example embodiment 3: The integrated circuit structure of embodiment 2, wherein at least one interconnect line from at least one of the first plurality of interconnect lines and the second plurality of interconnect lines is composed of two metal materials.

Example embodiment 4: The integrated circuit structure of embodiments 1, 2, or 3, wherein the width of the relatively narrow first plurality of interconnect lines ranges from approximately 10-100 nm, and the width of the relatively wide first plurality of interconnect lines ranges from approximately 100 nm-200 microns.

Example embodiment 5: The integrated circuit structure of embodiments 1, 2, 3 or 4, wherein a difference in the height between the first plurality of interconnect lines is approximately up to 200%.

Example embodiment 6: The integrated circuit structure of embodiments 1, 2, 3, 4, or 5, wherein the difference in the height between the plurality of interconnect lines ranges from approximately 50-100 nm.

Example embodiment 7: The integrated circuit structure of embodiments 1, 2, 3, 4, 5 or 6, wherein a maximum height of the first plurality of interconnect lines is limited by a metal level height of the first metal level.

Example embodiment 8: The integrated circuit structure of embodiments 1, 2, 3, 4, 5, 6, or 7, wherein the variable heights of the first plurality of interconnect lines range from approximately 50-200 nm.

Example embodiment 9: A method of fabricating an integrated circuit, the method comprises patterning and etching a dielectric material over a base to form trenches that have variable widths from relatively narrow trenches to relatively wide trenches. A conductive material is deposited to fill the relatively narrow trenches and the relatively wide (W) trenches. A first etch is performed process to recesses the conductive material in the trenches. An etch stop material is deposited to cover surfaces of the dielectric material and the conductive material. An etch back process is performed to remove portions of the etch stop material from tops of the conductive material in the relatively narrow trenches. A second etch process is performed to remove a remainder the etch stop material and to further recess the conductive material in the relatively narrow trenches to form a plurality of interconnect lines with variable widths and variable heights.

Example embodiment 10: The method of embodiment 9, further comprising: depositing the etch stop material such that an amount of the etch stop material landing at a bottom of the trenches is different, wherein the etch stop material is thicker in the relatively wide trenches.

Example embodiment 11: The method of embodiments 9 or 10, further comprising: providing the etch stop material such that the etch stop material has a selectivity to the conductive material.

Example embodiment 12: The method of embodiments 9, 10, or 11, wherein the conductive material in the trenches comprises a first conductive material, and wherein the etch stop material comprises a second conductive material.

Example embodiment 13: The method of embodiments 9, 10, 11, or 12, further comprising: patterning the trenches such that a width of the relatively narrow trenches ranges from approximately 10-100 nm, and a width of the relatively wide trenches ranges from approximately 100 nm-200 microns.

Example embodiment 14: The method of embodiments 9, 10, 11, 12 or 13, further comprising: wherein a difference in the height between the first plurality of interconnect lines is approximately up to 200%.

Example embodiment 15: The method of embodiments 9, 10, 11, 12, 13, 14 or 15, further comprising: wherein the difference in the height between the plurality of interconnect lines ranges from approximately 50-100 nm.

Example embodiment 16: The method of embodiments 9, 10, 11, 12, 13, 14 or 15, further comprising: forming the plurality of interconnect lines such that a maximum height of the plurality of interconnect lines is limited by a height of the metal level.

Example embodiment 17: The method of embodiments 9, 10, 11, 12, 13, 14, 15 or 16, further comprising: forming the plurality of interconnect lines such that the variable heights of the first plurality of interconnect lines range from approximately 50-200 nm.

Example embodiment 18: A method of fabricating an integrated circuit, the method comprises patterning and etching a dielectric material in a metal level to form trenches that have variable widths from relatively narrow trenches to relatively wide trenches. A conductive material is deposited to fill the relatively narrow trenches and the relatively wide trenches. A first etch process is performed to recesses the conductive material in the trenches to a target height designated for the relatively thin interconnect lines. A metal back-fill material is deposited to cover surfaces of the dielectric material and the conductive material. An etch back process is performed to remove portions of the metal back-fill material from the dielectric material, and from the conductive material in the relatively narrow (w) trenches, resulting in a plurality of interconnect lines having variable widths and variable heights in the metal level.

Example embodiment 19: The method of embodiment 18, further comprising: depositing the metal back-fill material such that an amount of the metal back-fill material landing at a bottom of the trenches is different, wherein the metal back-fill material is thicker in the relatively wide trenches.

Example embodiment 20: The method of embodiments 18 or 19, further comprising: patterning the trenches such that a width of the relatively narrow trenches ranges from approximately 10-100 nm;

Example embodiment 21: The method of embodiments 18, 19 or 20, further comprising: patterning the trenches such that a width of the relatively wide trenches ranges from approximately 100 nm-200 microns.

Example embodiment 22: The method of embodiments 18, 19, 20 or 21, further comprising: wherein a difference in the height between the first plurality of interconnect lines is approximately up to 200%.

Example embodiment 23: The method of embodiments 18, 19, 20, 21, or 22, further comprising: wherein the difference in the height between the plurality of interconnect lines ranges from approximately 50-100 nm.

Example embodiment 24: The method of embodiments 18, 19, 20, 21, 22, or 23, further comprising: forming the plurality of interconnect lines such that a maximum height of the plurality of interconnect lines is limited by a height of the metal level.

Example embodiment 25: The method of embodiments 18, 19, 20, 21, 22, 23, or 24, further comprising: forming the plurality of interconnect lines such that the variable heights of the first plurality of interconnect lines range from approximately 50-200 nm.

What is claimed is:

1. An integrated circuit structure, comprising:
   a base; and
   a plurality of metal levels over the base, wherein a first metal level includes:
   a first dielectric material; and
   a first plurality of interconnect lines in the first dielectric material, wherein the first plurality of interconnect lines in the first metal level have variable widths from relatively narrow to relatively wide, and wherein the first plurality of interconnect lines have variable heights based on the variable widths, such that a relatively wide one of the first plurality of interconnect lines has a taller height from a substrate than a relatively narrow one of the first plurality of interconnect lines, and a shorter distance to a top of the first metal level.

2. The integrated circuit structure of claim 1, further comprising:
   a via layer and a second dielectric material over the via layer;
   a second plurality of interconnect lines in the second dielectric material, wherein the second plurality of interconnect lines in a second metal level have variable widths from relatively narrow to relatively wide, and wherein the second plurality of interconnect lines have variable heights based on the variable widths, such that a relatively wide one of the second plurality of interconnect lines has a taller height from the via layer than a relatively narrow one of the second plurality of interconnect lines, and another shorter distance to a top of the second metal level.

3. The integrated circuit structure of claim 2, wherein at least one interconnect line from at least one of the first plurality of interconnect lines and the second plurality of interconnect lines is composed of two metal materials.

4. The integrated circuit structure of claim 1, wherein a width of the relatively narrow first plurality of interconnect lines ranges from approximately 10-100 nm, and the width of the relatively wide first plurality of interconnect lines ranges from approximately 100 nm-200 microns.

5. The integrated circuit structure of claim 1, wherein a difference in the height between the first plurality of interconnect lines is approximately up to 200%.

6. The integrated circuit structure of claim 1, wherein the difference in the height between the first plurality of interconnect lines ranges from approximately 50-100 nm.

7. The integrated circuit structure of claim 1, wherein a maximum height of the first plurality of interconnect lines is limited by a metal level height of the first metal level.

8. The integrated circuit structure of claim 4, wherein the variable heights of the first plurality of interconnect lines range from approximately 50-200 nm.

9. A method of fabricating an integrated circuit, the method comprising:
   patterning and etching a dielectric material over a base to form trenches that have variable widths from relatively narrow trenches to relatively wide trenches;
   depositing a conductive material to fill the relatively narrow trenches and the relatively wide (W) trenches;
   performing a first etch process to recesses the conductive material in the trenches;
   depositing an etch stop material to cover surfaces of the dielectric material and the conductive material;
   performing an etch back process to remove portions of the etch stop material from tops of the conductive material in the relatively narrow trenches; and
   performing a second etch process to remove a remainder the etch stop material and to further recess the conductive material in the relatively narrow trenches to form a plurality of interconnect lines with variable widths and variable heights, wherein relatively wide ones of the plurality of interconnect lines have a taller height from a substrate than a relatively narrow ones of the plurality of interconnect lines, and a shorter distance to a top of a metal level in which the plurality of interconnect lines are formed.

10. The method of claim 9, further comprising: depositing the etch stop material such that an amount of the etch stop material landing at a bottom of the trenches is different, wherein the etch stop material is thicker in the relatively wide trenches.

11. The method of claim 9, further comprising: providing the etch stop material such that the etch stop material has a selectivity to the conductive material.

12. The method of claim 9, wherein the conductive material in the trenches comprises a first conductive material, and wherein the etch stop material comprises a second conductive material.

13. The method of claim 9, further comprising: patterning the trenches such that a width of the relatively narrow trenches ranges from approximately 10-100 nm, and the width of the relatively wide trenches ranges from approximately 100 nm-200 microns.

14. The method of claim 9, further comprising: wherein a difference in the height between the first plurality of interconnect lines is approximately up to 200%.

15. The method of claim 9, further comprising: wherein the difference in the height between the plurality of interconnect lines ranges from approximately 50-100 nm.

16. The method of claim 9, further comprising: forming the plurality of interconnect lines such that a maximum height of the plurality of interconnect lines is limited by a height of the metal level.

17. The method of claim 9, further comprising: forming the plurality of interconnect lines such that the variable heights of the first plurality of interconnect lines range from approximately 50-200 nm.

18. A method of fabricating an integrated circuit, the method comprising:
   patterning and etching a dielectric material in a metal level to form trenches that have variable widths from relatively narrow trenches to relatively wide trenches;
   depositing a conductive material to fill the relatively narrow trenches and the relatively wide trenches;
   performing a first etch process to recesses the conductive material in the trenches to a target height designated for the relatively thin interconnect lines;
   depositing a metal back-fill material to cover surfaces of the dielectric material and the conductive material;
   performing an etch back process to remove portions of the metal back-fill material from the dielectric material, and from the conductive material in the relatively narrow (w) trenches, resulting in a plurality of interconnect lines having variable widths and variable heights in the metal level, wherein relatively wide ones of the plurality of interconnect lines have a taller height from a substrate than a relatively thin ones of the plurality of interconnect lines, and a shorter distance to a top of the metal level in which the plurality of interconnect lines are formed.

19. The method of claim 18, further comprising: depositing the metal back-fill material such that an amount of the metal back-fill material landing at a bottom of the trenches is different, wherein the metal back-fill material is thicker in the relatively wide trenches.

20. The method of claim 18, further comprising: patterning the trenches such that a width of the relatively narrow trenches ranges from approximately 10-100 nm.

21. The method of claim 18, further comprising: patterning the trenches such that a width of the relatively wide trenches ranges from approximately 100 nm-200 microns.

22. The method of claim 18, further comprising: wherein a difference in the height between the first plurality of interconnect lines is approximately up to 200%.

23. The method of claim 18, further comprising: wherein the difference in the height between the plurality of interconnect lines ranges from approximately 50-100 nm.

24. The method of claim 18, further comprising: forming the plurality of interconnect lines such that a maximum height of the plurality of interconnect lines is limited by a height of the metal level.

25. The method of claim 18, further comprising: forming the plurality of interconnect lines such that the variable heights of the first plurality of interconnect lines range from approximately 50-200 nm.

* * * * *